(12) United States Patent
Miyaki et al.

(10) Patent No.: US 9,859,794 B2
(45) Date of Patent: Jan. 2, 2018

(54) SEMICONDUCTOR DEVICE AND MOTOR CONTROL UNIT

(71) Applicant: DENSO CORPORATION, Kariya, Aichi-pref. (JP)

(72) Inventors: Hiroyuki Miyaki, Kariya (JP); Yutaka Ohashi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/064,353

(22) Filed: Mar. 8, 2016

(65) Prior Publication Data

US 2016/0268903 A1 Sep. 15, 2016

(30) Foreign Application Priority Data

Mar. 9, 2015 (JP) .................................. 2015-045768

(51) Int. Cl.
| | | |
|---|---|---|
| *H02P 6/24* | (2006.01) | |
| *H02P 25/22* | (2006.01) | |
| *H01L 25/07* | (2006.01) | |
| *H02M 3/158* | (2006.01) | |
| *H03K 17/0812* | (2006.01) | |

(52) U.S. Cl.
CPC ...... *H02M 3/158* (2013.01); *H03K 17/08122* (2013.01); *H03K 2217/0054* (2013.01)

(58) Field of Classification Search
CPC .............................. H01L 29/16; H01L 29/517
See application file for complete search history.

(56) References Cited

U.S. PATENT DOCUMENTS

| | | | | |
|---|---|---|---|---|
| 2010/0109588 A1* | 5/2010 | Koike | ................... | B62D 5/046 318/400.21 |
| 2014/0055059 A1* | 2/2014 | Uryu | ...................... | H02P 27/06 318/9 |
| 2014/0229066 A1* | 8/2014 | Harada | ............... | B62D 5/0481 701/41 |

FOREIGN PATENT DOCUMENTS

JP 2014-050032 A 3/2014

\* cited by examiner

*Primary Examiner* — Eduardo Colon Santana
*Assistant Examiner* — Charles S Laughlin
(74) *Attorney, Agent, or Firm* — Knobbe, Martens, Olson & Bear, LLP

(57) ABSTRACT

A semiconductor device includes a first switching element, a pre-driver, a coil, a second switching element and a capacitor. The first switching element is connected between a power and a load driving circuit and includes a parasitic diode having cathode adjacent to the load driving circuit. The pre-driver drives the first switching element. The coil is connected between the power and the first switching element. The second switching element includes an output terminal connected to a first connection point between the power and the coil, an input terminal connected to a second connection point between the first switching element and the pre-driver, and a control terminal connected to ground. The capacitor has one end connected to a point between the first switching element and the load driving circuit and another end connected to ground. Even when power supply voltage decreases, the semiconductor device can restrict breakage of switching element.

3 Claims, 6 Drawing Sheets

SEMICONDUCTOR DEVICE AND MOTOR CONTROL UNIT

CROSS REFERENCE TO RELATED APPLICATION

This application is based on Japanese Patent Application No. 2015-45768 filed on Mar. 9, 2015, the disclosure of which is incorporated herein by reference.

TECHNICAL FIELD

The present disclosure relates to a semiconductor device and a motor control unit having the semiconductor device.

BACKGROUND

In a load driving circuit that drives a load using a direct current (DC) power source, for example, a metal-oxide-semiconductor field-effect transistor (MOSFET) that controls a current conduction has been conventionally used. In such a load driving circuit, when the DC power source is reverse-connected, that is, connected in reverse direction, there is a possibility that an unexpected current flows to the load through a parasitic diode of the MOSFET, and the MOSFET and the load are thermally destroyed. In JP 2014-50032 A, a load driving circuit is connected to a reverse-connection protecting circuit that can interrupt a current when a DC power source is reverse-connected.

SUMMARY

Generally, in a motor control unit used for an electronic power steering device or the like, a semiconductor device including the reverse-connection protecting circuit as described above is connected to an input terminal of a motor driving portion as the load driving circuit. The semiconductor device further includes a coil and a capacitor. The coil decreases a change of a current provided from the DC power source and absorbs a noise. The capacitor assists a power supplying to the motor driving portion.

When the DC power source is reverse-connected, a first switching element of the reverse-connection protecting circuit is turned off and a current flowing in a direction from the motor driving portion to the DC power source is interrupted. In order to turn off the first switching element, the semiconductor device is formed so that extra resistance such as a coil is not connected between a control terminal and an input terminal of the first switching element.

In such a semiconductor device, however, there is a possibility that the first switching element is destroyed (avalanche breakdown) due to an inductance of the coil and charge stored in the capacitor when a power supply voltage decreases.

It is an object of the present disclosure to provide a semiconductor device capable of restricting a breakage of a switching element even when a power supply voltage decreases, and to provide a motor control unit having the semiconductor device.

According to an aspect of the present disclosure, a semiconductor that is to be connected between a DC power source and a load driving circuit includes a first switching element, a pre-driver, a coil, a second switching element and a capacitor.

The first switching element is connected between the DC power source and the load driving circuit, and includes a control terminal and a parasitic diode having a cathode adjacent to the load driving circuit.

The pre-driver is connected to the control terminal of the first switching element and outputs a signal for switching on and off of the first switching element.

The coil is connected between the DC power source and the first switching element.

The second switching element includes an output terminal, an input terminal and a control terminal. The output terminal is connected to a first connection point between the DC power source and the coil. The input terminal is connected to a second connection point between the control terminal of the first switching element and the pre-driver. The control terminal is connected to a ground The capacitor has one end connected to a point between the first switching element and the load driving circuit and another end connected to a ground.

In the above structure, the first switching element and the second switching element provide a reverse-connection protecting circuit that interrupts a current flowing from the load driving circuit to the DC power source when the DC power source is reverse-connected to the load driving circuit.

Specifically, when the DC power source is reverse-connected, the second switching element is forward-biased and turned on. Charge is released from the control terminal of the first switching element through the second switching element, and a voltage between the control terminal and the input terminal of the first switching element can be decreased to be lower than an on-threshold. In such a case, when the pre-driver outputs an off signal to the first switching element, the first switching element can be completely turned off. As such, the current flowing from the motor driving portion to the DC power source can be interrupted, and a breakage of the motor driving portion can be restricted.

In the above structure, the output terminal of the second switching element is connected to a point between the DC power source and the coil. In other words, the second switching element and the coil are connected to a wiring between the control terminal and the input terminal of the first switching element. As a result, the breakage of the first switching element does not occur when the DC power source is forward-connected.

Specifically, when the power supply voltage decreases, a current flows in a reverse direction from the capacitor to the DC power source due to charge stored in the capacitor. In such a case, when the pre-driver outputs an off signal to the first switching element, a state of the first switching element is changed to a half-on state and a regenerative current is generated in the coil.

In the present disclosure, however, even when the regenerative current is generated in the coil, the second switching element is not affected by the regenerative current and is kept in the off state. Therefore, the first switching element is kept in the half-on state and is not completely turned off. Hence, the avalanche breakdown does not occur in the first switching element.

Accordingly, the semiconductor device according to the aspect of the present disclosure can restrict the first switching element from being destroyed even when the power supply voltage decreases.

Also, the semiconductor device according to the aspect of the present disclosure can be employed to a motor control unit that is driven by electricity outputted from a motor driving portion as the load driving circuit.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

A semiconductor device according to an embodiment of the present disclosure and a motor control unit including the semiconductor device will be described hereinafter with reference to drawings.

The motor control unit according to an embodiment of the present disclosure is employed to, for example, an electric power steering device of a vehicle. The electric power steering device can assist a steering operation of a driver by transmitting a steering assisting torque to a column or a rack through a reduction gear, the steering assisting torque being outputted by a motor driven by the motor control unit.

(Structure of Driving Device)

Figure 1:
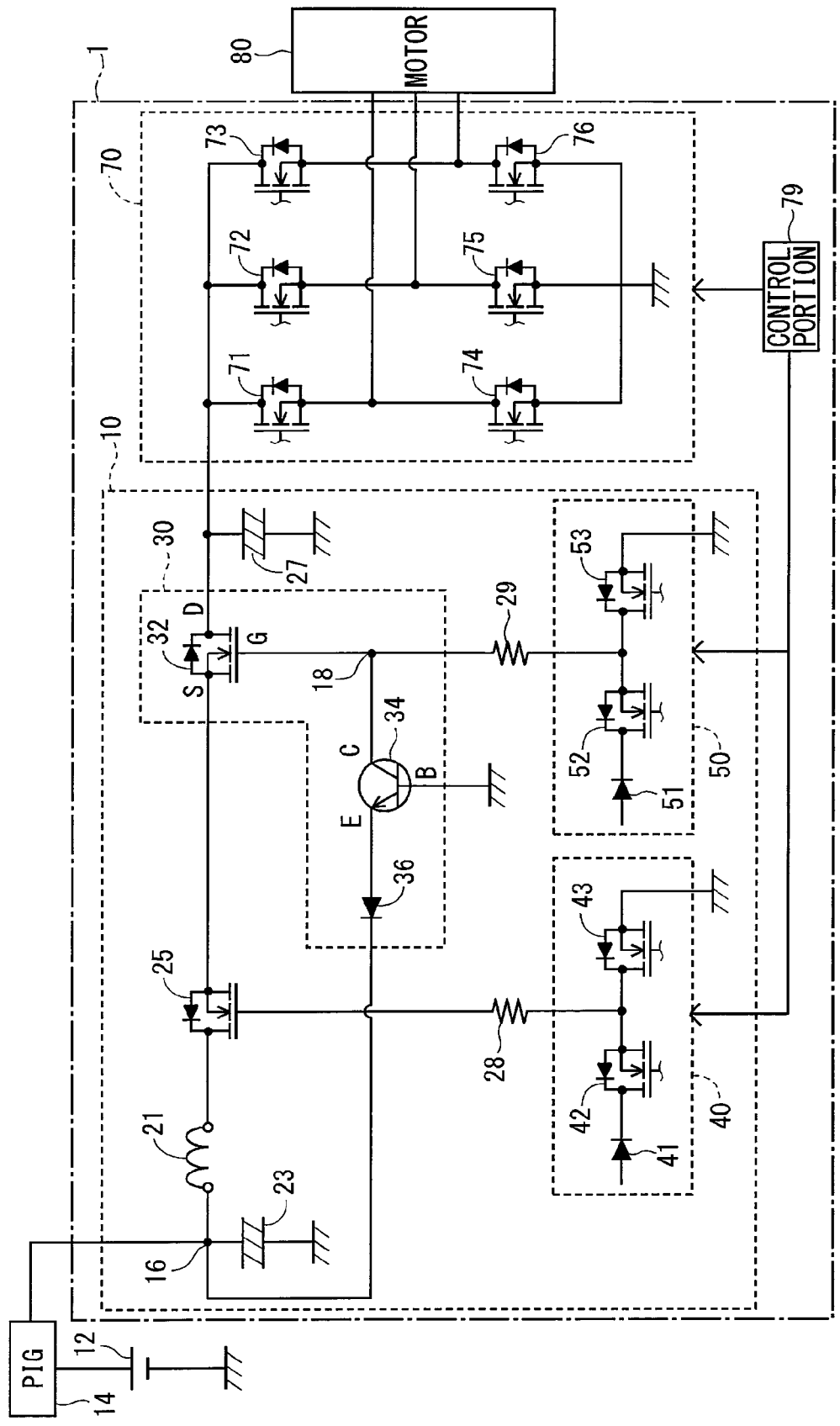
FIG. 1 is a circuit diagram illustrating a motor control unit including a semiconductor device according to an embodiment of the present disclosure.

An electrical structure of a motor control unit 1 of the present embodiment will be described with reference to FIG. 1. As shown in FIG. 1, the motor control unit 1 is connected to a battery 12 through a power ignition (PIG) terminal 14. The battery 12 is an example of a direct current power source. When a control circuit, which is not illustrated, is turned on, the motor control unit 1 starts its operation and controls a motor 80, which is a load. For example, the motor 80 is a three-phase brushless motor.

The motor control unit 1 includes the semiconductor device 10, an inverter portion 70 and a control portion 79. The inverter portion 70 is an example of a load driving circuit (motor driving portion).

First, the semiconductor device 10 will be described. The semiconductor device 10 includes a coil 21, a capacitor 23, a power relay 25, a reverse-connection protecting circuit 30, a capacitor 27 and pre-drivers 40, 50.

The coil 21 is, for example, a choke coil. The coil 21 has one end connected to the battery 12 and the other end connected to the power relay 25. The capacitor 23 has one end connected to a first connection point 16 between the battery 12 and the coil 21 and the other end connected to the ground.

The coil 21 and the capacitor 23 provide a filter circuit. The filter circuit reduces a noise that is transmitted to the motor 80 from other devices connected to the common battery 12, and a noise that is transmitted to the other devices connected to the common battery 12 from the motor 80. The coil 21 can reduce a change of a current provided by the battery 12.

The power relay 25 is disposed between the coil 21 and a first switching element 32 of the reverse-connection protecting circuit 30 and can interrupt a current flowing in a direction from the battery 12 to the inverter portion 70. The power relay 25 is, for example, a MOSFET.

The reverse-connection protecting circuit 30 includes the first switching element 32, a second switching element 34 and a diode 36.

The first switching element 32 is, for example, an N-channel-type MOSFET. The first switching element 32 is hereinafter referred to as a MOS 32. The MOS 32 has a source connected to the power relay 25, a drain connected to the inverter portion 70. The MOS 32 is arranged so that a parasitic diode of the MOS 32 has a cathode adjacent to the inverter portion 70. That is, a direction of the parasitic diode of the MOS 32 is opposite to a direction of a parasitic diode of the power relay 25.

The second switching element 34 is, for example, an NPN-type bipolar transistor. The second switching element 34 is hereinafter referred to as a transistor 34. The transistor 34 has an emitter connected to the first connection point 16 between the battery 12 and the coil 21, and a collector connected to a second connection point 18 between a gate of the MOS 32 and the pre-driver 50. A base of the transistor 34 is connected to the ground.

The diode 36 is disposed between the transistor 34 and the first connection point 16. The diode 36 has a cathode adjacent to the first connection point 16. When the battery 12 is forward-connected, that is, a connection direction of the battery 12 is forward (normal), the diode 36 interrupts a current flowing from the battery 12 to the transistor 34 through the first connection point 16.

The capacitor 27 has one end connected to a point between the MOS 32 and the inverter portion 70 and the other end connected to the ground. The capacitor 27 stores charge to assist the power supplying to the inverter portion 70. The capacitor 27 is, for example, an aluminum electrolytic capacitor that has a large capacity.

The pre-driver 40 is connected to the gate of the power relay 25 through a resistor 28 disposed between the power relay 25 and the pre-driver 40. The pre-driver 40 includes a diode 41 and two switching elements 42 and 43. In the present embodiment, the switching elements 42, 43 are MOSFETs. The pre-driver 40 is controlled by the control portion 79 to output a signal for controlling on/off of the power relay 25 to the power relay 25.

The pre-driver 50 is connected to the gate of the MOS 32 through a resistor 29 disposed between the MOS 32 and the pre-driver 50. The pre-driver 50 includes a diode 51 and two switching elements 52 and 53. In the present embodiment, the switching elements 52, 53 are MOSFETs. The pre-driver 50 is controlled by the control portion 79 to output a signal for controlling on/off of the MOS 32 to the MOS 32.

The gate of the MOS 32 is connected to the ground through a parasitic diode of the switching element 53 of the pre-driver 50. Therefore, in order to completely turn off the MOS 32 when the battery 12 is reverse-connected, that is, when the connection direction of the battery 12 is reverse, the pre-driver 50 needs to output an off signal and, additionally, charge needs to be released from the gate of the MOS 32 through the transistor 34.

When the pre-driver 50 outputs the off signal and the transistor 34 is off, the MOS 32 is in a half-on state. The half-on state is a state where a potential exists between the drain and the gate.

In the present embodiment, the inverter portion 70 is a three-phase inverter. The inverter portion 70 includes six switching elements 71 to 76 that are connected in a bridge configuration. The switching elements 71 to 76 are, for example, MOSFETs. Connection points between the highpotential-side switching elements 71, 72, 73 and the low-potential-side switching elements 74, 75, 76 are connected to an end of a winding of the motor 80 through power lines. The switching elements 71 to 76 execute switching operations to convert electricity provided by the battery 12 and provided to the motor 80. The control portion 79 controls an operation of the inverter portion 70 based on external signals transmitted from a rotation angle sensor of the motor 80 and the like. Also, the control portion 79 outputs control signals to the pre-drivers 40 and 50.

(Basic Operation of Reverse-Connection Protecting Circuit 30)

When the battery 12 is reverse-connected, a base-emitter junction of the transistor 34 is forward-biased and the transistor 34 is turned on. Charge of the gate of the MOS 32 is released through the transistor 34 and the diode 36. In such a case, when the pre-driver 50 outputs the off signal to the MOS 32, a gate-source voltage of the MOS 32 is exhausted and the MOS 32 is completely turned off. As a result, a current flowing in a direction (reverse direction) from the inverter portion 70 to the battery 12 is interrupted.

Accordingly, the reverse-connection protecting circuit 30 can prevent the current from flowing in the reverse direction when the battery 12 is reverse-connected, and can restrict the other elements of the motor control unit 1 from being destroyed.

Comparative Example

A motor control unit 101 including a semiconductor device 110 will be described as a comparative example with reference to FIG. 4 to FIG. 6. In the motor control unit 101 shown in FIG. 4, similar structures to the embodiment described hereinabove are designated by the same symbols as the embodiment. In FIG. 5A to 5C, a part of the structure shown in FIG. 4 is omitted.

Figure 4:
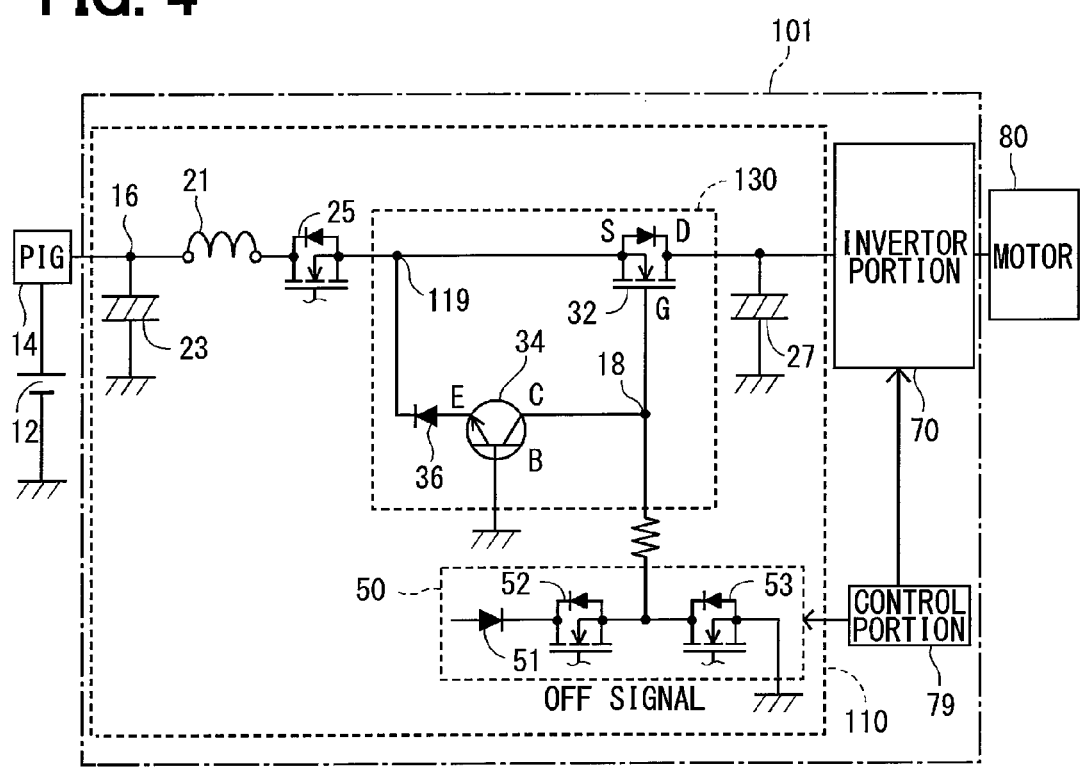
FIG. 4 is a circuit diagram illustrating a circuit structure of a motor control unit including a semiconductor device according to a comparative example.
Figure 5A:
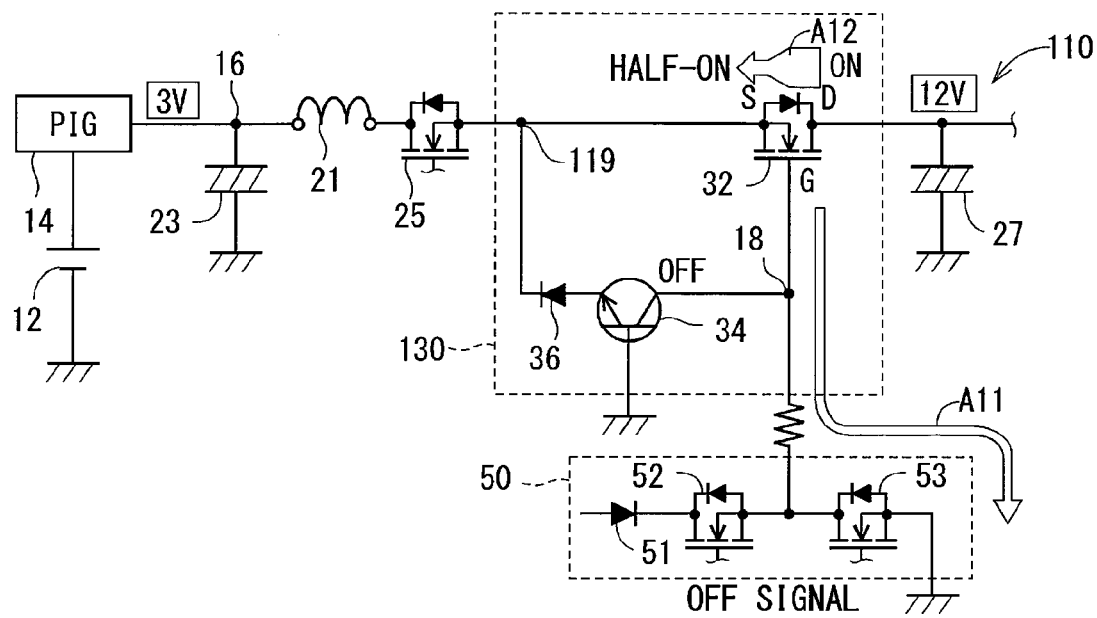
FIG. 5A to FIG. 5C are schematic diagrams explaining operations of the semiconductor device of FIG. 4.

As shown in FIG. 4, the motor control unit 101 includes the semiconductor device 110 and an inverter portion 70. The semiconductor device 110 has a similar structure to the semiconductor device 10 of the above embodiment other than a point that the emitter of the transistor 34 is connected to a connection point 119 between the power relay 25 and the MOS 32.

A basic operation of the reverse-connection protecting circuit 130 of the comparative example is similar to the embodiment described hereinabove.

Specifically, when the battery 12 is reverse-connected, the base-emitter junction of the transistor 34 is forward-biased and the transistor 34 is turned on. The gate charge of the MOS 32 is released through the transistor 34 and the diode 36. In such a case, when the pre-driver 50 outputs the off signal to the MOS 32, the gate-source voltage of the MOS 32 is exhausted and the MOS 32 is completely turned off. As a result, the current flowing in the direction (reverse direction) from the inverter portion 70 to the battery 12 is interrupted.

In the comparative example, in order to exhaust the gate-source voltage of the MOS 32 by the basic operation of the reverse-connection protecting circuit 130, a resistance other than the transistor 34 is not connected to a wiring from the gate to the source of the MOS 32. Therefore, the emitter of the transistor 34 is connected to the connection point 119 between the power relay 25 and the MOS 32.

In the comparative example, however, when the battery 12 is forward-connected, there is the following issue. The issue of the comparative example will be described with reference to FIG. 5A to 5C and FIG. 6. FIG. 6 is a graph illustrating changes of a gate voltage, a source voltage and a current of the MOS 32 while the power supply voltage decreases.

There is a possibility that the power supply voltage of the battery 12 decreases due to, for example, cranking. In such a case, the control portion 79 controlling the pre-driver 50 is shut down or executes an initial check at the time of restarting, and allows the pre-driver 50 to output the off signal (time point T11). As a result, as shown in FIG. 5A, the gate charge of the MOS 32 is gradually released through the pre-driver 50 (see an arrow A11). A state of the MOS 32 is changed from an on state to a half-on state.

When the power supply voltage of the battery 12 decreases, a current flows in a direction (reverse direction) from the capacitor 27 storing the charge to the battery 12. When the state of the MOS 32 is changed from the on state to the half-on state while the current flows in the reverse direction, the current flowing in the reverse direction through the MOS 32 is reduced (see an arrow A12).

Figure 5B:
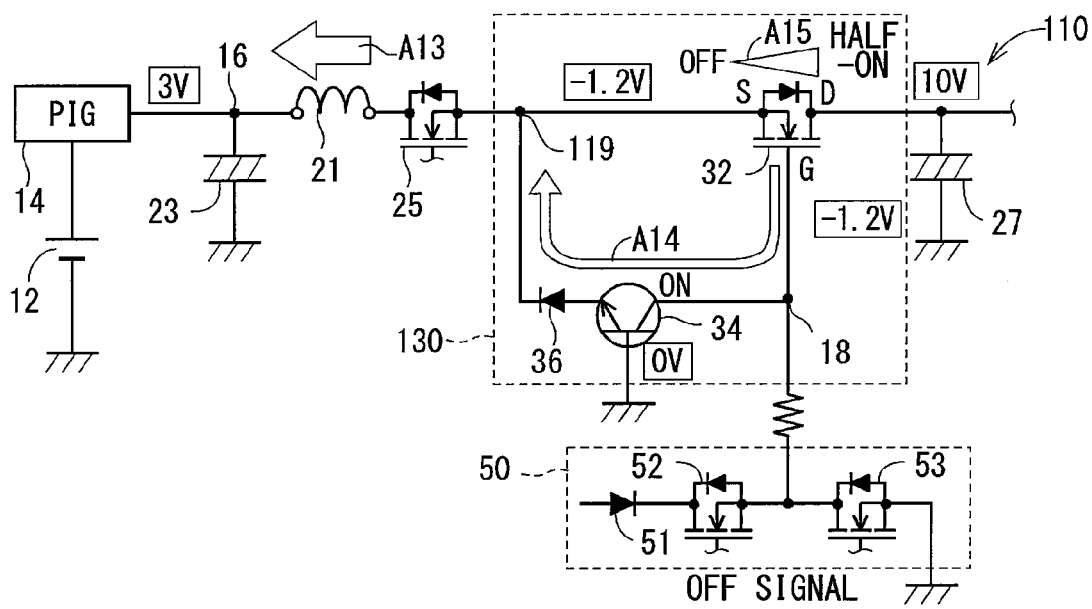
Figure 6:
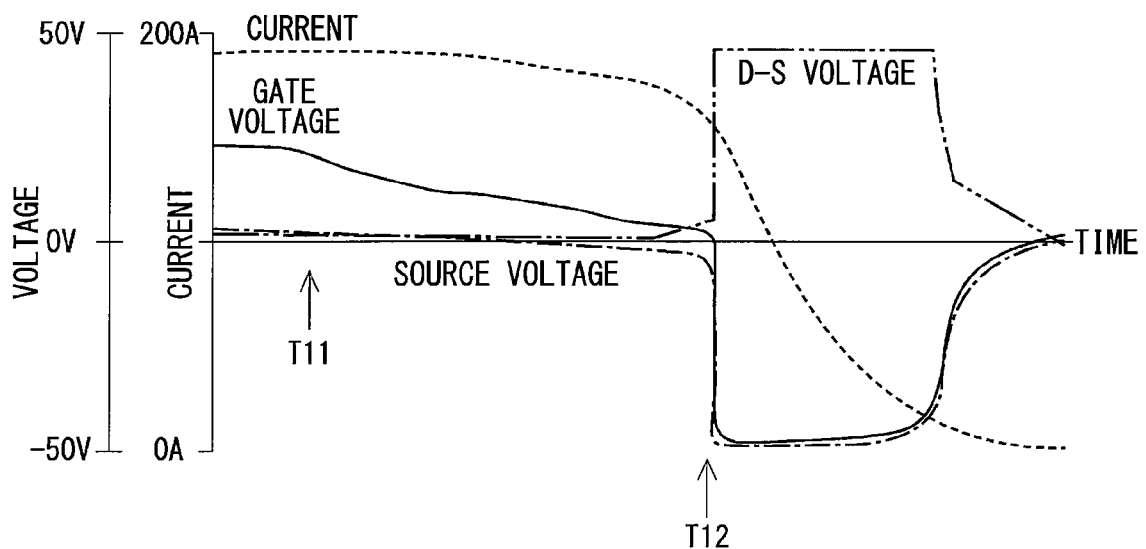
FIG. 6 is a graph illustrating changes of a current and a voltage of a first switching element of the semiconductor device of FIG. 4.

When the current flowing through the MOS 32 is reduced, as shown in FIG. 5B, a regenerative current is generated in the coil 21 to keep the current flowing (see an arrow A13). When the regenerative current flowing in the reverse direction is generated in the coil 21, a voltage of the connection point 119, which is located closer to the capacitor 27 than the coil 21, decreases to be lower than 0V (for example, −1.2 V). In this case, the transistor 34 has an emitter voltage lower than 0V, and a base voltage equal to 0V. Since the base-emitter junction of the transistor 34 is forward-biased, the transistor 34 is tuned on.

When the transistor 34 is turned on, the gate charge of the MOS 32 is instantly released through the transistor 34 and the diode 36 (see an arrow A14), and the gate-source voltage of the MOS 32 is exhausted. In this case, the state of the MOS 32 is changed from the half-on state to the off state (time point T12). Also, the current flowing in the direction (reverse direction) from the capacitor 27 to the battery 12 is suddenly interrupted by the MOS 32 (see an arrow A15).

Figure 5C:
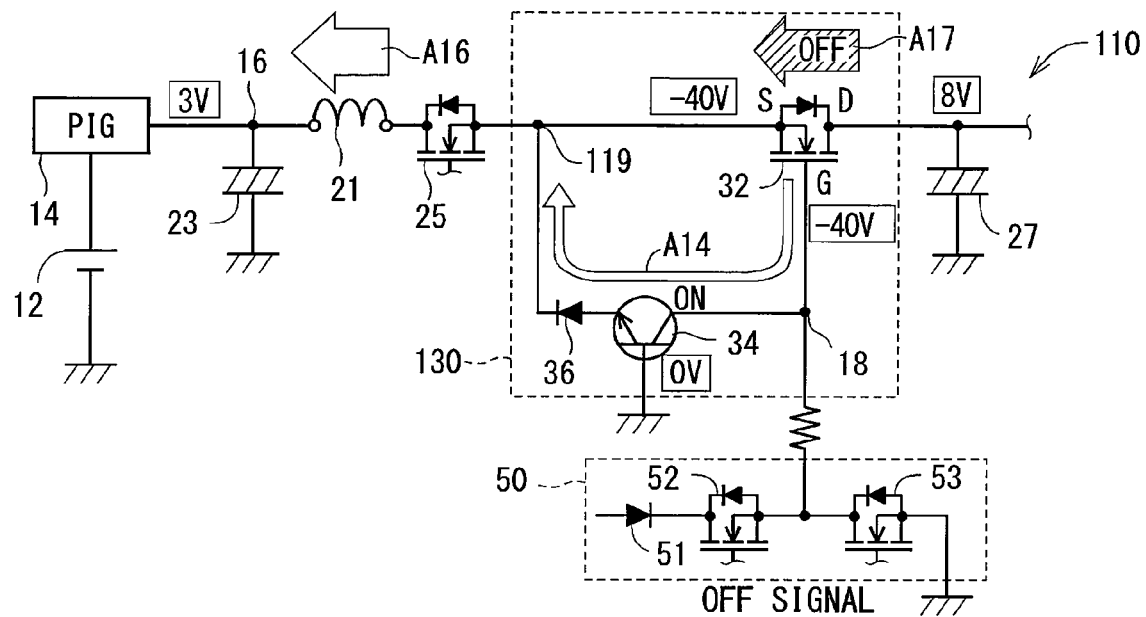

When the MOS 32 is turned off, as shown in FIG. 5C, a larger regenerative current is generated in the coil 21 (see an arrow A16). In this case, the voltage of the connection point 119, which is located closer to the capacitor 27 than the coil 21, suddenly decreases. The MOS 32 has the gate voltage and the source voltage equal to or lower than, for example, −40V.

When the MOS 32 is turned off (time point T12), the charge of the capacitor 27 decreases, but still remains. Therefore, the drain voltage of the MOS 32 is larger than 0V (for example, about 8V).

Accordingly, the MOS 32, which is turned off, has a voltage larger than a rated voltage that the MOS 32 can resist (for example, about 50V) between the drain and the source. As a result, an avalanche breakdown is occurred in the MOS 32.

(Effects)

(1) As described above, the semiconductor device 10 of the present embodiment includes the MOS 32 as the first switching element, the pre-driver 50, the coil 21, the transistor 34 as the second switching element, and the capacitor 27.

In the present embodiment, differently from the comparative example, the emitter of the transistor 34 is connected to the first connection point 16 between the battery 12 and the coil 21. That is, the transistor 34 and the coil 21 are disposed on a wiring from the gate to the source of the MOS 32. Also in this structure, the reverse-connection protecting circuit 30 can normally execute the basic operation when the battery 12 is reverse-connected.

Figure 2A:
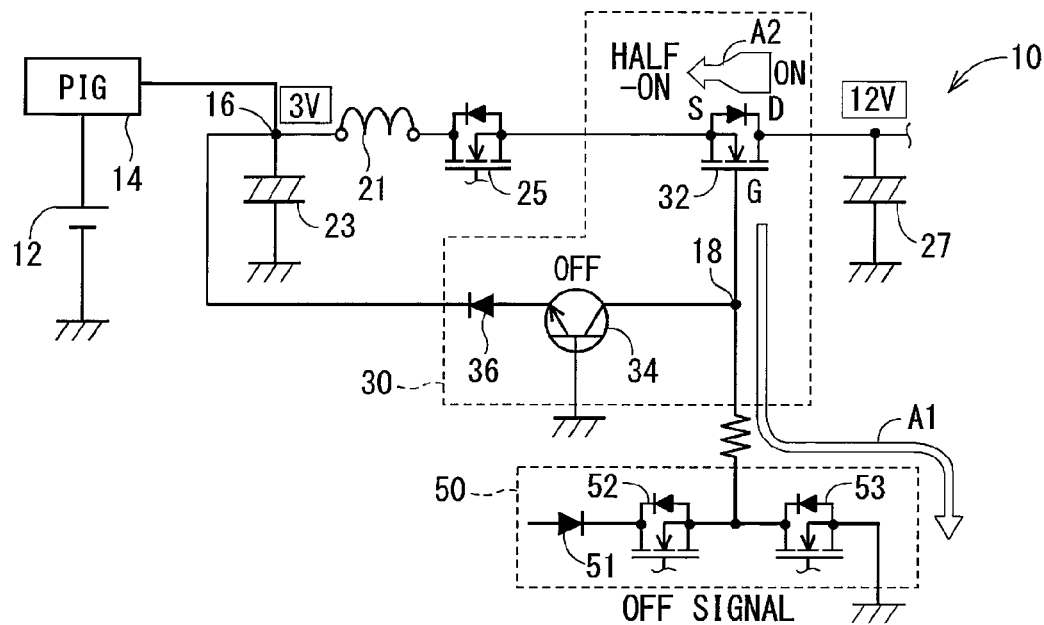
FIG. 2A to FIG. 2C are schematic diagrams explaining operations of the semiconductor device of FIG. 1.
Figure 2B:
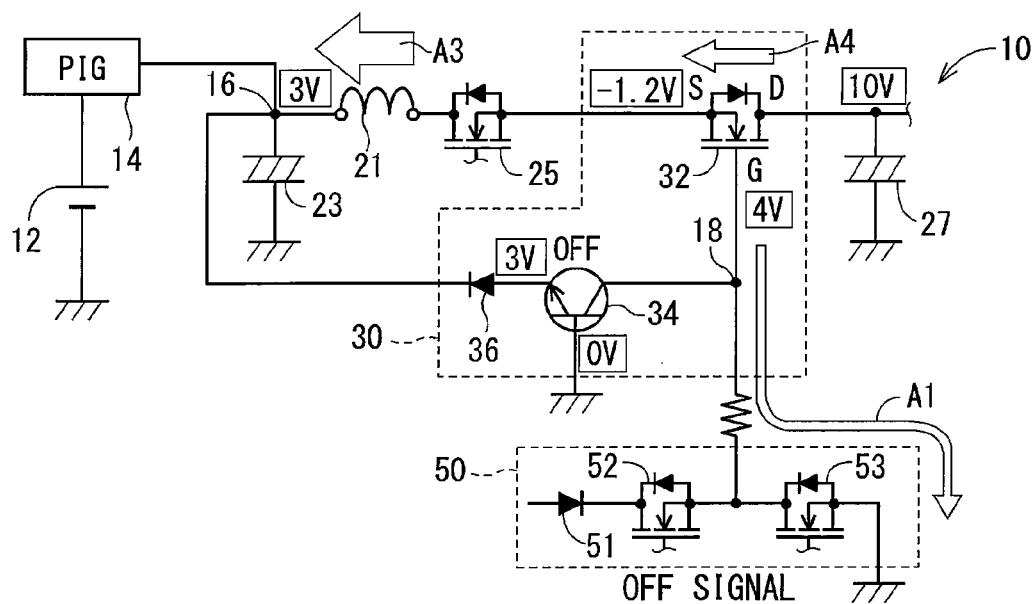
Figure 2C:
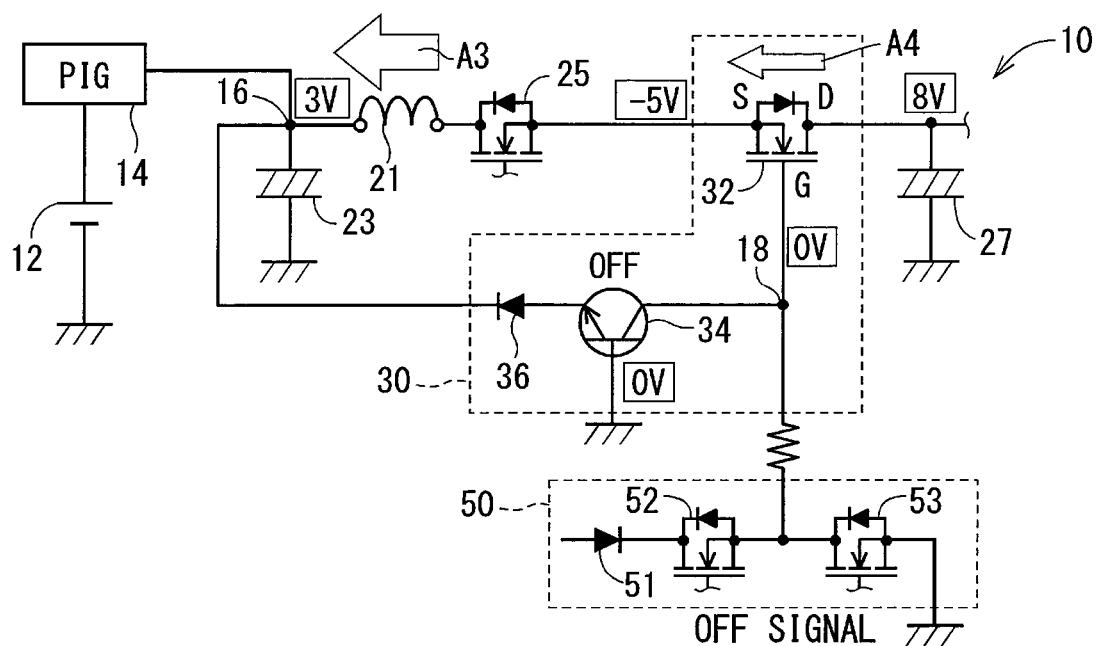
Figure 3:
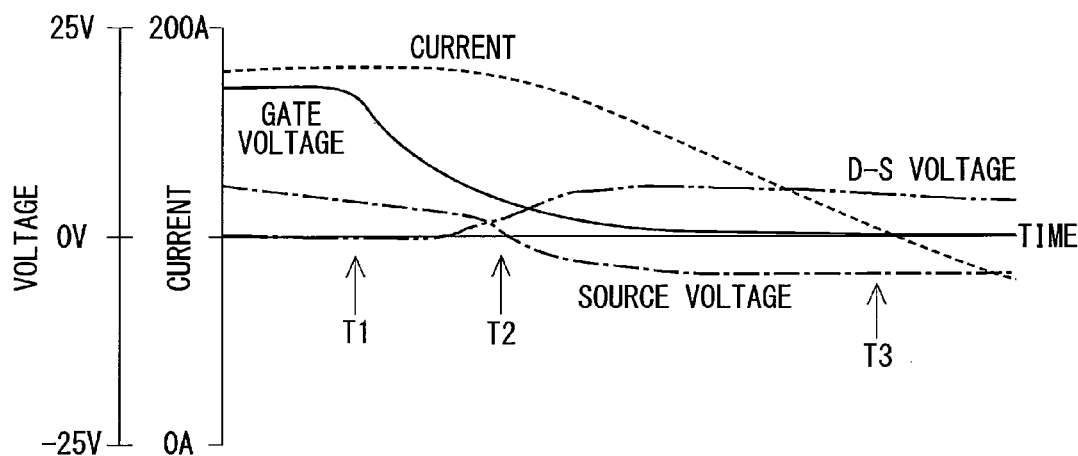
FIG. 3 is a graph illustrating changes of a current and a voltage of a first switching element of the semiconductor device of FIG. 1.

According to the present embodiment, the issue occurring in the comparative example when the battery 12 is forward-connected, that is, the avalanche breakdown of the MOS 32 can be restricted. Effects of the present embodiment will be described with reference to FIG. 2A to 2C and FIG. 3. FIG. 3 is a graph illustrating changes of the gate voltage, the source voltage and the current of the MOS 32 while the power supply voltage decreases. In FIG. 2A to 2C, a part of the structure shown in FIG. 1 is omitted.

When the power supply voltage of the battery 12 decreases due to, for example, cranking, the pre-driver 50 outputs an off signal (time point T1). As shown in FIG. 2A, the gate charge of the MOS 32 is gradually released through the pre-driver 50 (see an arrow A1). A state of the MOS 32 is changed from an on state to a half-on state.

When the power supply voltage of the battery 12 decreases, a current flows in a direction (reverse direction) from the capacitor 27 storing the charge to the battery 12. When the state of the MOS 32 is changed from the on state to the half-on state while the current flows from the capacitor 27 in the reverse direction, the current flowing through the MOS 32 in the reverse direction is reduced (see an arrow A2).

When the current flowing through the MOS 32 in the reverse direction is reduced, as shown in FIG. 2B, a regenerative current is generated in the coil 21 to keep the current flowing (see an arrow A3).

When the regenerative current in the reverse direction is generated in the coil 21, a voltage of a region closer to the capacitor 27 than the coil 21, decreases to be lower than 0V (for example, −1.2 V). On the other hand, a voltage of the first connection point 16, which is located closer to the battery 12 than the coil 21, is substantially equal to the power supply voltage and larger than 0V (for example, 3V). In this case, the transistor 34 has the emitter voltage larger than 0V (for example, 3V) and the base voltage equal to 0V. Therefore, the base-emitter of the transistor 34 is reverse-biased, and the transistor 34 is kept in the off state. As a result, the gate charge of the MOS 32 is not instantly released through the transistor 34, but gradually released through the pre-driver 50 (see an arrow A1).

Namely, right after the regenerative current is generated (time point T2), the gate voltage of the MOS 32 is kept larger than 0V (for example, around 4V) and the source voltage of the MOS 32 decreases to be lower than 0V (for example, −1.2V). Therefore, since the MOS 32 has the gate-source voltage (about 5V), the MOS 32 is kept in the half-on state and the current continues to flow through the MOS 32 in the reverse direction (see an arrow A4).

When the source voltage of the MOS 32 further decreases due to an effect of the regenerative current, the gate-source voltage of the MOS 32 relatively increases and the state of the MOS 32 approaches to the on state from the half-on state. In such a case, a reduction of the current in the reverse direction by the MOS 32 is weakened and the source voltage of the MOS 32 slightly increases. As a result, the state of the MOS 32 returns to the half-on state. The operation described above is repeated so that the MOS 32 is kept in the half-on state.

When entirety of the gate charge of the MOS 32 is released through the pre-driver 50 and the gate voltage of the MOS 32 decreases to be equal to 0V (time point T3), the source voltage of the MOS 32 further decreases (for example, −5V). That is, as shown in FIG. 2C, the MOS 32 has the gate-source voltage (about 5V) and is kept in the half-on state.

As described above, while the power supply voltage decreases, the MOS 32 can be kept in the half-on state until the charge of the capacitor 27 is exhausted. As a result, in the MOS 32 of the present embodiment, the avalanche breakdown as described in the comparative example does not occur.

It is assumed the worst case scenario in which the power supply voltage decreases to 0V due to the cranking in the semiconductor device 10 including a wiring with a high inductance and the coil 21 with a low inductance. In such a case, there is a possibility that the voltage of the first connection point 16 is lower than 0V (for example, −3V). Since the base-emitter of the transistor 34 is forward-biased, the transistor 34 is turned on.

In the above structure, however, when the transistor 34 is turned on, the gate voltage of the MOS 32 is equal to the voltage of the first connection point 16. On the other hand, the source voltage of the MOS 32 decreases to be lower than the voltage of the first connection point 16 due to a counter electromotive force generated in the coil 21. Therefore, the MOS 32 has the gate-source voltage and can be kept in the half-on state. That is, the avalanche breakdown does not occur in the worst case scenario described above.

Accordingly, the semiconductor device 10 of the present embodiment can restrict the MOS 32 from being destroyed even when the power supply voltage decreases.

(2) In the present embodiment, the first switching element 32 is the MOSFET and the second switching element 34 is a bipolar transistor. The semiconductor device 10 can be suitably constituted by these switching elements.

(3) The semiconductor device 10 of the present embodiment can be employed to the motor control unit 1 including the inverter portion 70 as a concrete example of the load driving circuit. The motor control unit 1 includes the coil 21 and the capacitor 27 in order to drive the motor 80 stably. The coil 21 reduces the change of the current provided from the battery 12 and absorbs the noise. The capacitor 27 assists the power supplying to the inverter portion 70. Therefore, the semiconductor device 10 of the present embodiment can be suitably employed to manage the issue caused by the inductance of the coil 21 and the charge stored in the capacitor 27, that is, the avalanche breakdown of the first switching element 32.

When the motor control unit 1 is employed to the electric power steering device, there is a possibility that the off signal is outputted to the MOS 32 when the power supply voltage decreases due to the cranking as described above. The semiconductor device 10 of the present embodiment can be especially effective in this case.

Other Embodiments

Although in the above embodiment, the first switching element 32 is the MOSFET and the second switching element 34 is the bipolar transistor, the first switching element 32 and the second switching element 34 are not limited to them and may be other switching elements.

In the above embodiment, an example is described in which the semiconductor device 10 is employed to the motor control unit 1 including the inverter portion 70 as the load driving circuit. However, the present disclosure is not limited to the above embodiment, and, for example, the load driving circuit may be other circuit such as an H bridge circuit.

Also, the load driving circuit may be a circuit driving a load other than the motor 80 such as the actuator.

The present disclosure is not limited to the embodiments and may be implemented in various other ways without departing from the gist of the present disclosure.

What is claimed is:

1. A semiconductor device connected between a direct current power source and a load driving circuit, the semiconductor device comprising:
   a first switching element that is connected between the direct current power source and the load driving circuit and includes a control terminal and a parasitic diode having a cathode adjacent to the load driving circuit;
   a pre-driver that is connected to the control terminal of the first switching element and outputs a signal for switching on and off of the first switching element;
   a coil that is connected between the direct current power source and the first switching element;
   a second switching element that includes an output terminal connected to a first connection point between the direct current power source and the coil so as to keep the second switching element in off state and restrict a charge of the first switching element being instantly released when a regenerative current is generated in the coil, an input terminal connected to a second connection point between the control terminal of the first switching element and the pre-driver, and a control terminal connected to a ground; and
   a capacitor that has one end connected to a point between the first switching element and the load driving circuit and another end connected to a ground.

2. The semiconductor device according to claim 1, wherein
   the first switching element is a metal-oxide-semiconductor field-effect transistor, and
   the second switching element is a bipolar transistor.

3. A motor control unit comprising:
   the semiconductor device according to claim 1;
   a motor driving portion operating as the load driving circuit; and
   a control portion controlling an operation of the motor driving portion, wherein
   a motor is driven by an electricity outputted from the motor driving portion.

* * * * *